(12) United States Patent
Pisano et al.

(10) Patent No.: US 9,335,217 B2
(45) Date of Patent: May 10, 2016

(54) PYROELECTRIC ALUMINUM NITRIDE MEMS INFRARED SENSOR WITH SELECTIVE WAVELENGTH INFRARED ABSORBER

(71) Applicant: THE REGENTS OF THE UNIVERSITY OF CALIFORNIA

(72) Inventors: Albert Pisano, Del Mar, CA (US); David Horsley, Albany, CA (US); Kansho Yamamoto, Otsu Shiga (JP)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/448,877

(22) Filed: Jul. 31, 2014

(65) Prior Publication Data

US 2015/0035110 A1 Feb. 5, 2015

Related U.S. Application Data

(60) Provisional application No. 61/861,224, filed on Aug. 1, 2013.

(51) Int. Cl.
| | |
|---|---|
| *B81B 3/00* | (2006.01) |
| *G01J 5/08* | (2006.01) |
| *H01L 37/02* | (2006.01) |
| *H01L 27/146* | (2006.01) |
| *G01J 5/34* | (2006.01) |
| *B81C 1/00* | (2006.01) |

(52) U.S. Cl.
CPC ............ *G01J 5/0853* (2013.01); *G01J 5/34* (2013.01); *H01L 27/14649* (2013.01); *H01L 27/14683* (2013.01); *H01L 37/02* (2013.01); *B81B 3/0045* (2013.01); *B81C 1/0015* (2013.01)

(58) Field of Classification Search
CPC . G01J 5/0853; H01L 27/14683; H01L 37/02; B81B 3/0045; B81B 3/0027; B81C 1/0015
USPC .......................................... 257/416
See application file for complete search history.

(56) References Cited

U.S. PATENT DOCUMENTS

| | | | | |
|---|---|---|---|---|
| 2003/0089842 A1* | 5/2003 | Moon et al. | .............. | 250/227.11 |
| 2006/0276005 A1* | 12/2006 | Yang | ............................. | 438/455 |
| 2010/0148067 A1* | 6/2010 | Cheon et al. | ................ | 250/338.1 |
| 2012/0012741 A1* | 1/2012 | Vasylyev | .................. | 250/237 R |
| 2013/0023063 A1* | 1/2013 | Matsushima et al. | ............. | 438/3 |
| 2013/0099118 A1* | 4/2013 | Tomioka | ........................ | 250/332 |
| 2013/0300521 A1* | 11/2013 | Khine et al. | .................... | 333/187 |
| 2014/0004379 A1* | 1/2014 | Eguchi | .......................... | 428/661 |
| 2014/0037504 A1* | 2/2014 | Masters et al. | .............. | 422/82.01 |

* cited by examiner

*Primary Examiner* — Nathan Ha
(74) *Attorney, Agent, or Firm* — Blank Rome LLP

(57) ABSTRACT

A MEMS sensor for detecting electromagnetic waves in a particular frequency range is provided. In a preferred embodiment, the MEMS sensor comprises a bottom substrate layer; a first electrode layer over the substrate layer; a pyroelectric layer over the first electrode layer; and a second electrode layer over the pyroelectric layer; wherein a top electrode layer is patterned with a periodic structure that has a periodicity less than or equal to target infrared wavelength.

19 Claims, 11 Drawing Sheets

2.00 µm/div

PYROELECTRIC ALUMINUM NITRIDE MEMS INFRARED SENSOR WITH SELECTIVE WAVELENGTH INFRARED ABSORBER

This application claims the benefit of U.S. Provisional Patent Application No. 61/861,224, filed Aug. 1, 2013, and titled "Pyroelectric Aluminum Nitride MEMS Infrared Sensor with Selective Wavelength Infrared Absorber," which is hereby incorporated by reference in its entirety.

FIELD

The present patent document relates to MEMS sensors. More particularly, the present patent document relates to MEMS sensors for detecting infrared light.

COPYRIGHT

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limiting its rights pursuant to 37 C.F.R. §1.14.

BACKGROUND

There is an increasing number of developments in the area of uncooled infrared sensors using Micro Electro Mechanical systems (MEMS) structures. In principle, in this structure, the sensor elements absorb incident infrared, transfer them to heat, measure the temperature, and then output electric signals. Materials such as pyroelectric material, thermopile and bolometers are often used to produce MEMS infrared sensors. It is important for the sensor elements to structurally have minimal thermal capacities and good heat conductance in order to achieve higher sensitivities, and therefore, MEMS structures are often used. The absorbing spectrums of current sensor elements are usually broad, so optical filters are required to enable absorptions of particular wavelengths of infrared light. If optical filters could be eliminated, it would not only reduce the cost of manufacture, but it would also be possible to produce a single platform with numerous different wavelength absorptions using the MEMS process. Such a technology could be applied to many existing industries including for example, Non Dispersive Infrared (NDIR) type multi-channel gas sensors. Recent studies in the area of selective tunable infrared sensors propose the use of thermopile structures or bolometers having the surface plasmon or metamatelial structures with periodic structures of metal, structurally integrated into the sensor elements.

SUMMARY OF THE EMBODIMENTS

In view of the foregoing, an object according to one aspect of the present patent document is to provide a MEMS type pyroelectric sensor for infrared detection and methods related thereto. Preferably, the methods and apparatuses address or at least ameliorate one or more of the problems described above. To this end, a MEMS sensor is provided. In one embodiment, the MEMS sensor includes: a substrate layer; a first electrode layer adjacent the substrate layer; a pyroelectric layer adjacent the first electrode layer; and a second electrode layer adjacent the pyroelectric layer, wherein the second electrode layer is patterned with a periodic structure that has a periodicity less than or equal to 8 µm.

In some embodiments, the second electrode layer is the top layer. However, in other embodiments, more than three layers may be used. In embodiments with more than three layers, additional electrode layers and additional pyroelectric layers may be between the substrate and the second electrode layer.

In some embodiments, the patterned periodic structure comprises a hole array structure. In other embodiments, the patterned periodic structure comprises a stripe structure.

In a preferred embodiment, the periodic structure has a periodicity less than a target infrared wavelength according to the equation $P \leq \lambda$ where P is periodicity and $\lambda$ is target infrared wavelength.

In yet other embodiments, the sensor includes at least two sensor elements and each of the two sensor elements has a periodic structure patterned with different periodicities.

Depending on the embodiment, the layers of the sensor may be made of various different materials. In one embodiment, the pyroelectric layer or layers may be comprised of various different materials. In some embodiments with more than one layer, different layers may be made from different materials. In preferred embodiments, the pyroelectric layer is comprised from a material selected from the group consisting of PZT, ZnO, PVDF, AlN, and c-axis oriented AlN. In some embodiments, the first electrode layer comprises Molybdenum. In some embodiments, the second electrode layer may also comprise Molybdenum. In still other embodiments, the pyroelectric layer comprises AlN.

The various different layers of the sensor may also have different thicknesses. In a preferred embodiment, the first electrode layer has a thickness ranging from about 10 nm to about 1000 nm. In some embodiments, the second electrode layer may also have a thickness ranging from about 10 nm to about 1000 nm. In preferred embodiments, the pyroelectric layer has a thickness according to the equation $2 \times t \times n_\lambda \leq \lambda$ where t is the pyroelectric film thickness, $\lambda$ is the target infrared wavelength, and $n_\lambda$ is the index of the pyroelectric material at the target infrared wavelength.

In preferred embodiments, the patterned periodic structure comprises a hole array structure or a stripe structure. In some embodiments, the periodic structure has a periodicity less than a target infrared wavelength. In yet other embodiments, the patterned periodic structure is a hole array and the diameter of a hole in the hole array is provided according to the equation $r \geq P$ multiplied by 0.5 where r is the hole diameter and P is the periodicity of the patterned periodic structure. In still yet other embodiments, the periodic structure may be comprised by a stripe structure having a line/spacing (L/S) of about 1.

In another aspect of the present patent document, a method of making a MEMS sensor element is provided. In a preferred embodiment, the method includes: forming a first electrode layer on a substrate; forming a pyroelectric layer over the electrode layer; forming a second electrode layer over the pyroelectric layer; and creating a patterned periodic structure in a top electrode layer of the MEMS sensor wherein the patterned periodic structure has a periodicity less than or equal to a target infrared wavelength.

As described more fully below, the apparatus and methods of the embodiments of a MEMS sensor for detecting a selected wavelength range are provided. Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

By way of example, and not of limitation, the present patent document teaches a pyroelectric type infrared sensor where the sensor element also acts as the absorption structure for particular wavelengths of infrared light. In a preferred embodiment, the sensor has a tri-layer structure of metal/dielectric/metal layers.

Within the present patent document, ranges of values are used to help define different embodiments. When referring to any numerical range of values herein, such ranges are understood to include each and every number and/or fraction between the stated range minimum and maximum. For example, a range of about 0.05 to about 1.0, for example, would expressly include all intermediate values of about 0.05, 0.06, 0.07, all the way up to and including 0.98, 0.99 and 1.0. The same applies to all other elemental ranges set forth below, including those incorporated by reference below.

In addition, the term "about" is used to provide flexibility to a value and particularly to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

Figure 1:
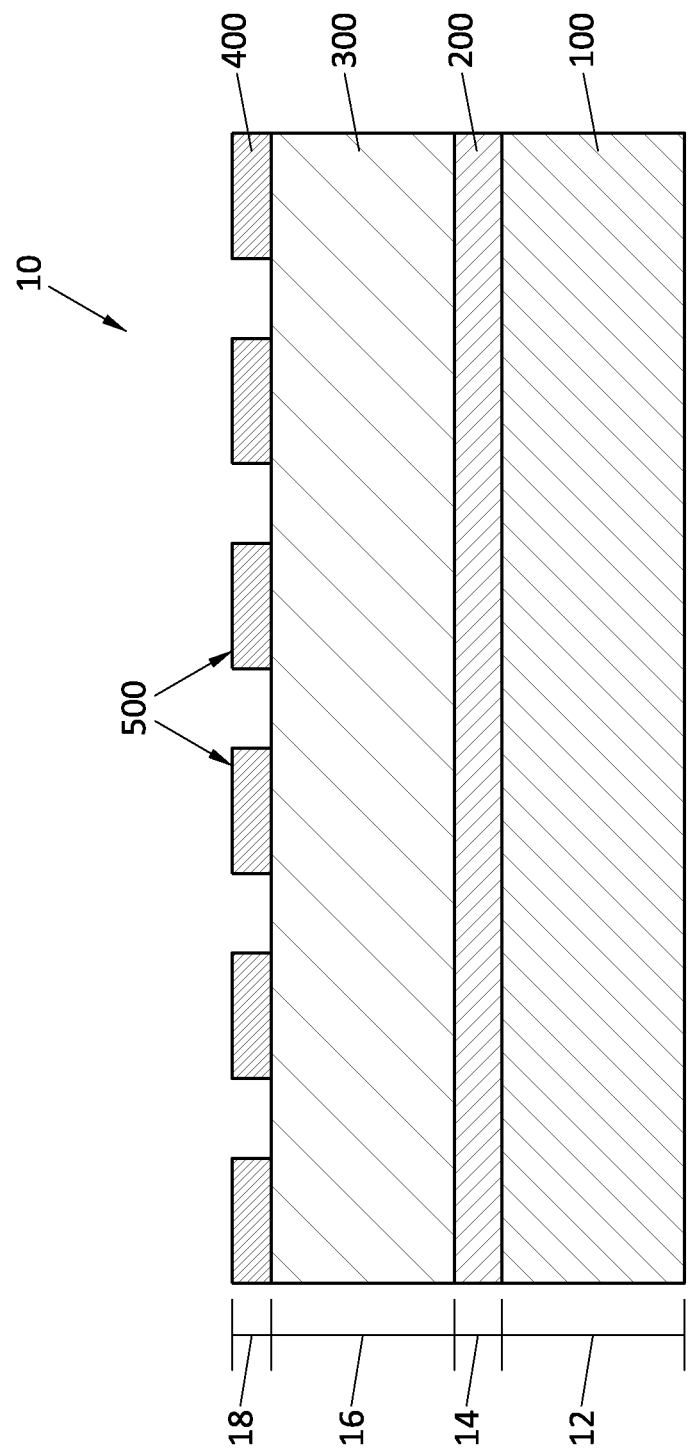
FIG. 1 illustrates a schematic cross-sectional view of one embodiment of a sensor element for a sensor device.

FIG. 1 illustrates a schematic cross-sectional view of one embodiment of a sensor element 10 for use with a sensor device. As may be seen in FIG. 1, a preferred embodiment of the sensor element 10 includes three layers supported by a substrate layer 100. In the embodiment shown, the tri-layer sensor structure comprises a bottom electrode layer 200, a pyroelectric film layer 300, and a top electrode layer 400 that is patterned with a periodic structure 500. As may be seen in FIG. 1, each layer has a thickness 12, 14, 16 and 18 respectively. One advantage of this structure is that it can achieve selective absorption of infrared radiation in a specific band of optical wavelengths. Various different embodiments may be created that have different absorption properties by varying any one of: 1) the thickness 16 of the pyroelectric material 300; 2) the top electrode material 400; 3) the thickness 18 of top electrode 400; or, 4) the periodicity and shape of the top electrode 400. Because sensor devices like the one shown in FIG. 1 may be design to be sensitive to only a narrow wavelength range, an additional optical filter is not required. This technology is suitable for many different applications. Sensors in accordance with the teachings of the present patent document may be used to replace current infrared sensors. One example use of the sensors taught herein would be for a NDIR type $CO_2$ gas sensor.

Although in FIG. 1 a tri-layer sensor is shown, other embodiments may have other numbers of layers above the substrate layer 100. However, regardless of the number of layers used, the top layer always includes a patterned periodic structure.

In preferred embodiments, the thickness 14 of the bottom electrode 200 ranges from about 10 nm to about 1000 nm. The 10 nm lower value of the range represents a thickness sufficient to prevent infrared radiation from passing through the bottom electrode. The 1000 nm upper value of the range is based on the limits of the MEMS fabrication process. Accordingly, the range may extend beyond those limits if infrared radio could otherwise be prevented from passing through the bottom electrode or if fabrication techniques permitted thicker layer fabrication. Even more preferably, the thickness 14 of the bottom electrode 200 ranges from about 100 nm-200 nm. The 100 nm-200 nm range is desirable for the pyroelectric material's crystal quality.

The bottom electrode 200 may be fabricated from various metal materials, although Molybdenum is preferred. Molybdenum has low resistivity, as well as good crystallinity which is oriented in the (101) direction on (0001) Aluminum Nitride (AlN) film. Other possible materials for the bottom electrode include but are not limited to Gold, Platinum, Titanium, Aluminum are also available for bottom electrode.

With regard to the pyroelectric material 300, preferred embodiments use AlN because AlN exhibits the following characteristics: 1.) good crystal quality; 2.) transparent in the mid-wavelength infrared (3 μm to 8 μm) region; and, 3.) large band gap of 6.2 eV with low tan δ, which means it is a good insulating material for signal to noise ratio.

While AlN film may be used in the preferred embodiments, other MEMS process-compatible piezoelectric material groups may be used for pyroelectric material 300. As non-limiting examples, in some embodiments, ZnO, polyvinylidene difluoride (PVDF), or lead zirconate titanate (PZT) may be used.

In a preferred embodiment, the thickness 16 of pyroelectric material 300 preferably satisfies the following conditions:

$$2 \times t \times n_\lambda \leq \lambda$$

where t is the pyroelectric film thickness, λ is the target infrared wavelength, and $n_\lambda$ is the index of the pyroelectric material at the target infrared wavelength. To this end, different embodiments may be constructed according to the teachings of the present patent document to target different wavelengths of light by varying the thickness 16 of pyroelectric material 300. In a preferred embodiment, the thickness 16 of pyroelectric material 300 ranges from 10 nm to 3000 nm. In an even more preferred embodiment, the thickness 16 of pyroelectric material 300 may range from 100 nm to 1500 nm.

Moving on to the top electrode 400, in different embodiment, various different metals may be used. In a preferred embodiment, the thickness 18 of top electrode 400 is preferably in the range from about 10 nm to about 1000 nm. The thickness 18 of top electrode 400 is preferably based on the same considerations as used for selecting the thickness 12 of the bottom electrode 100, as explained above. In yet other embodiments and more preferably, the thickness 18 of top electrode 400 may be about 100 nm-200 nm, which is desirable for the workability of the top patterning process.

In one embodiment, the top electrode layer 400 has a patterned periodic structure 500. The periodic pattern may be of any type but preferably its one of a hole array structure or stripe structure. Although in preferred embodiments the hole shape is round, in other embodiments, the holes may be rectangle, circle, triangle, diamond or any other shape.

In a preferred embodiment, the periodicity is less than or equal to the target infrared wavelength such that the periodicity P satisfies the following equation:

$$P \leq \lambda$$

As used herein, periodicity refers to the distance between successive elements of the patterned periodic structure. For example, if the pattered periodic structure is a hole array, the periodicity is equal to the distance between center points of any two of the patterned holes. As another non-limiting example, if the patterned periodic structure is a stripe structure, the periodicity is equal to the distance between centerlines of any two of the patterned stripes. Accordingly, embodiments that satisfy the above equation have a period spacing that is less than or equal to the wavelength of infrared light they are designed to measure. In some of those embodiments, the periodicity is less than the target infrared wavelength. In yet other embodiments, other periodicities may be used.

Although in some embodiments, the equation $P \leq \lambda$ is strictly followed, in other embodiments, the equation may be a guiding principle. For example, in some embodiments, the periodicity may be approximately less than or equal to the target wavelength. In such embodiments, the periodicity may be slightly larger than the target wavelength. In a preferred embodiment, the periodicity is less than or equal to 110% of the target wavelength. In yet other embodiments, the periodicity is less than or equal to 105%, or more preferably 103%, or even more preferably 101% of the target wavelength.

Figure 5:
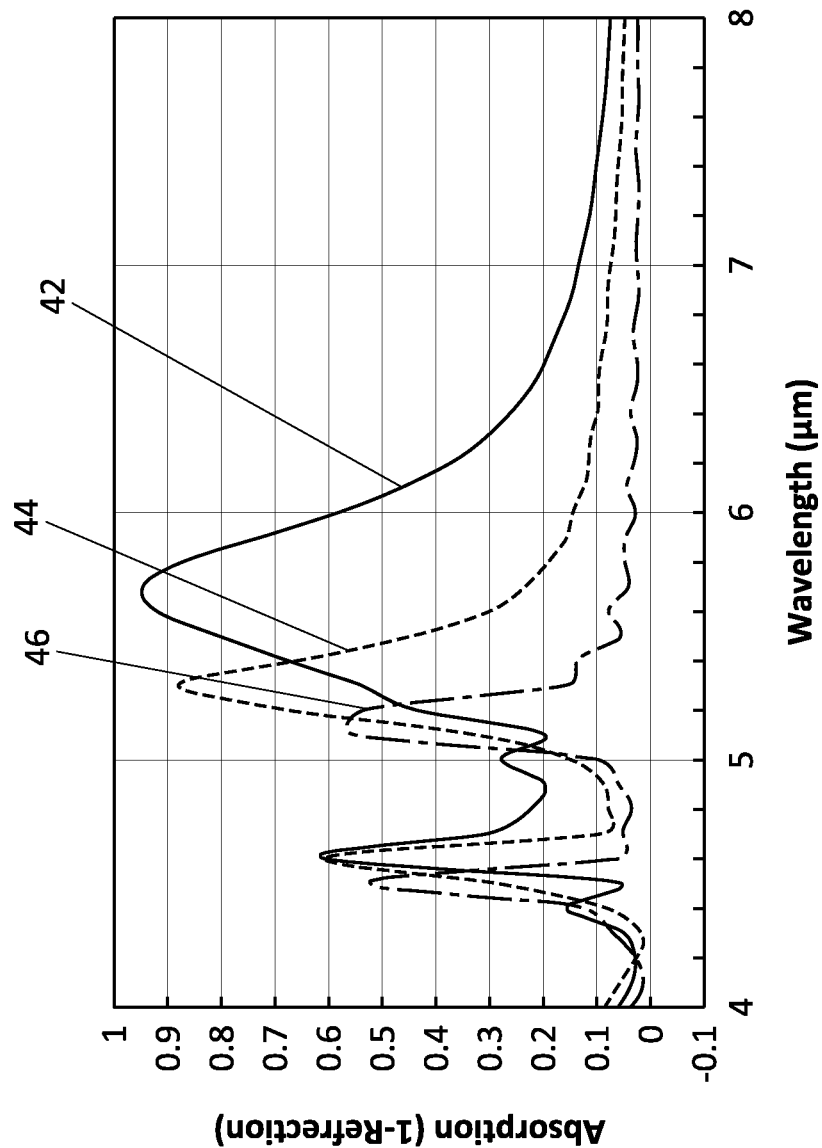
FIG. 5 illustrates a numerical calculation of the absorption spectra with respect to the hole diameter size: diameters are 1.0 μm (green-dotted), 1.25 μm (blue-dashed), 1.5 μm (red-solid).

The preferred shape of the patterned periodic structure 500 is one of hole arrays or stripe structure. In embodiments where the patterned periodic structure 500 is hole arrays, the structure preferably satisfies the following formula:

$$r/P \geq 0.5$$

where (r is the diameter of the hole). FIG. 5, which illustrates the absorption spectra in relation to the hole diameter, explains why the above equation is preferable. Although having $r/P \geq 0.5$ is preferably, other embodiments may use a less restrictive or more restrictive criteria. For example, hole array embodiments may have an r/P: ≥0.55, ≥0.6 or even ≥0.7. Other embodiments my have an r/P: ≥0.4 or even ≥0.3.

In embodiments where the periodic structure 500 is a stripe structure, the line/space (L/S) is preferably about 1. However in other embodiments, the L/S ranges may be from about 0.1 to about 0.9.

Although FIG. 1. only shows a single pyroelectric MEMS sensor element 10, in other embodiments, a pyroelectric MEMS sensor may be comprised of multiple sensor elements 10. In some of those embodiments, different sensor elements 10 may have a patterned periodic structure 500 with different electrode periodicity. It is also possible to fabricate multiple detectors targeting different absorption wavelengths on the same substrate and with the same fabrication process, which is not possible with existing technology.

Moving down a layer to the pyroelectric film 300. In various embodiments, the pyroelectric film 300 comprises a material selected from the group consisting of PZT, ZnO, PVDF, and AlN. In one embodiment, the pyroelectric film comprises c-axis oriented AlN. AlN is a CMOS compatible material. Further, AlN is transparent in the infrared region (between 1-10 μm). Additionally, AlN has a large band gap of 6.2 eV and has a low tan δ, which means it is a good insulating material for signal to noise ratio.

A number of specific examples will now be described to further illustrate the embodiments disclosed herein. It should be understood that the below examples are just a few of the possible embodiments at taught herein. As is well known, the claims define the scope of the embodiments patented.

Example 1

In the first example, both the substrate layer 100 and the dielectric layer 300 are made from Aluminum Nitride (AlN). AlN film functions both as the pyroelectric film for sensor elements and also as dielectric material for infrared absorptions. Molybdenum (Mo) was used for the bottom metal layer 200 and the top metal layer 400 to serve as the electrodes for the pyroelectric film. For example 1, a sub-wavelength hole array structure was chose for the top metal layer 400. Infrared light at a normal incident will strongly interact, given this structure. The resonating infrared lights inside the structure will eventually lose energy and be converted to heat. This heat will be detected both by the second layer, or AlN acting as the pyroelectric layer, and the electrodes of the top and bottom electric layer.

AlN films are versatile piezoelectric material, and are commonly used for electromechanical resonators, filters and sensors such as accelerometer s. Additionally, AlN films are also considered a pyroelectric material, and their pyroelectric charge coefficient is reported to be 6-8 $\mu C/m^2 K$. AlN's pyroelectric coefficient is smaller than other pyroelectric materials such as Lead Zirconate Titanate (PZT) film. AlN film's small permittivity and dielectric losses contributes to high voltage sensitivities. AlN has deposition abilities at lower temperatures than PZT, and notably, AlN is also a complementary metal-oxide semiconductor (CMOS) compatible material.

Example 2

Figure 2C:
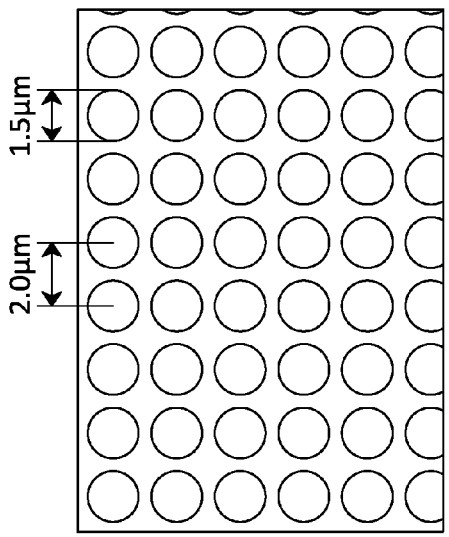
FIG. 2C is an SEM image of the whole sensor device of FIG. 2A.
Figure 2D:
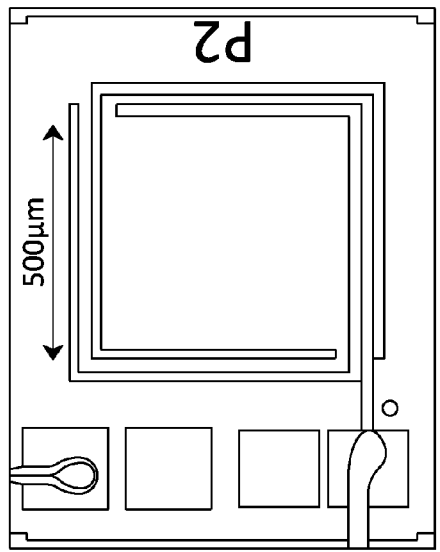
FIG. 2D is an SEM image of the top Mo hole array of the sensor device of FIG. 2A.
Figure 2A:
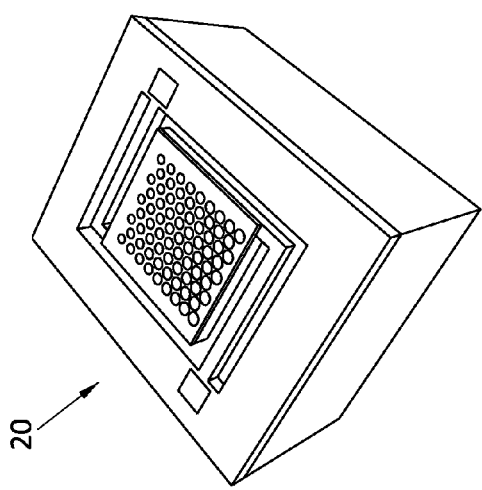
FIG. 2A illustrates a perspective view of one embodiment of a sensor device.
Figure 2B:
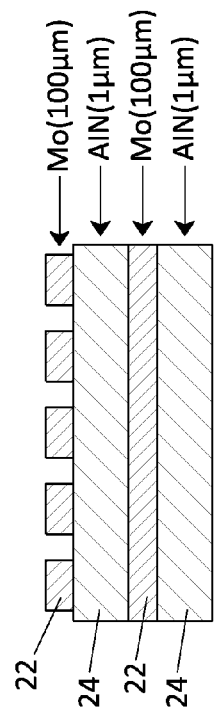
FIG. 2B illustrates a cross section of a one embodiment of a sensor element for use in the sensor device of FIG. 2A.

FIG. 2A illustrates a perspective view of one embodiment of a complete sensor device 20. In the embodiment shown in FIG. 2A, the sensor device 20 is connected to the substrate by two legs. FIG. 2B depicts the cross-section of the sensor elements of the sensor device of FIG. 2A. In FIG. 2B, the top layer 22 and the layer second down from the top 22 are a 100 nm thick (typ. about 10 nm to about 1000 nm) Mo electrode (shown in red). The bottom layer 24 and the first layer down from the top 24 are 1 µm thick AlN films (shown in blue), which satisfies the following formula:

$$2 \times t \times n_\lambda \leq \lambda.$$

The top Mo layer 22 has hole arrays with 2 µm periods (which satisfies P≤λ) implemented. Structural scanning electron microscope (SEM) images are shown in FIG. 2C and FIG. 2D. The area of the device's surface is 500 µm (typ. about 10 µm to about 2000 um) square meters. The top Mo electrode has 2 µm period (which satisfies P≤λ) holes with diameters approximately 1.5 µm (which satisfies r/P≥0.5)), arrayed in a square.

Example 3

Figure 3:
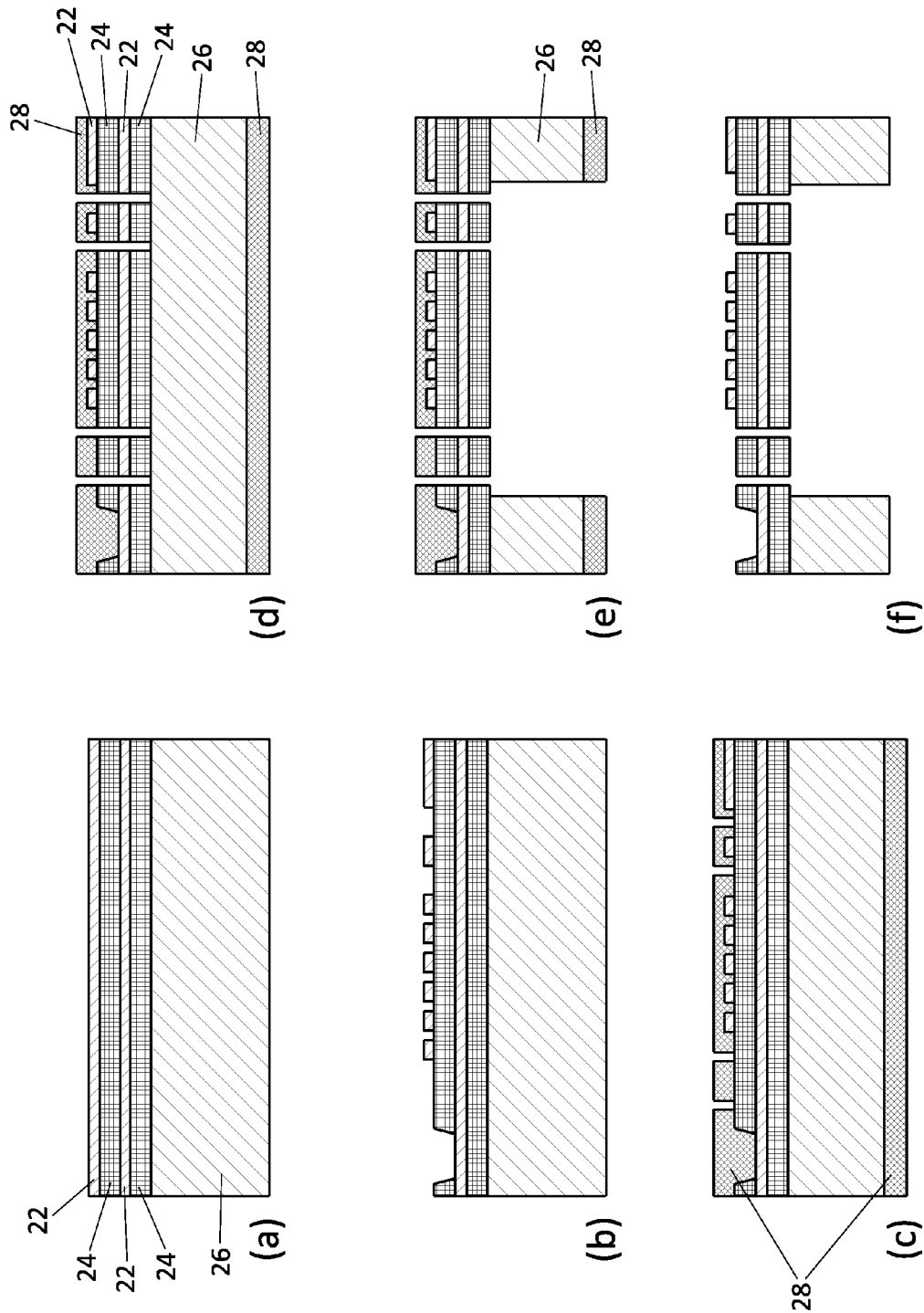
FIG. 3 illustrates a CMOS compatible fabrication process flow of one embodiment of a sensor device.

A CMOS compatible fabrication process flow of one embodiment of a sensor device 20 is shown in FIG. 3. At step (a) AlN 24 and Mo 22 are deposited continuously and alternately 1 µm/100 nm/1 µm/100 nm on a six inch double polished silicon wafer 26. Mo and AlN was deposited by reactive magnetron sputtering method. The top AlN layer 24 is strongly (0001) oriented, and has rocking curve full width half-maximum of approximately 1.5 degrees (typ. about 0.1 degrees to about 10.0 degrees). The lower layer AlN 24 functions as the etching stop layer during Deep Reactive Ion Etching (DRIE).

Subsequently, at step (b) the top electrode Mo 22 is patterned by reactive ion etching. The top Mo 22 periodic structure is formed during this procedure. Afterwards, the top AlN layer 24 is etched using wet etching, and the lower electrode is electrically drawn out.

At step (c) 2 µm SiO$_2$ 28 (typ. about 100 nm to 10 µm, which depends on the etching selectivity SiO$_2$/AlN) is deposited as the hard mask using Low Pressure Chemical vapor deposition (LPCVD).

At step (d), AlN layers 24 and Mo layers 22 are etched concurrently by RIE using the SiO$_2$ layer 28 from step (c) as a mask. At step (e) the backside of the SiO$_2$ layer is patterned. The silicon is etched by DRIE. Lastly, at step (f) the SiO$_2$ hard mask is removed by wet etching using hydrogen fluoride, the heat-insulated structure is formed and the device is completed.

Example 4

Figure 4:
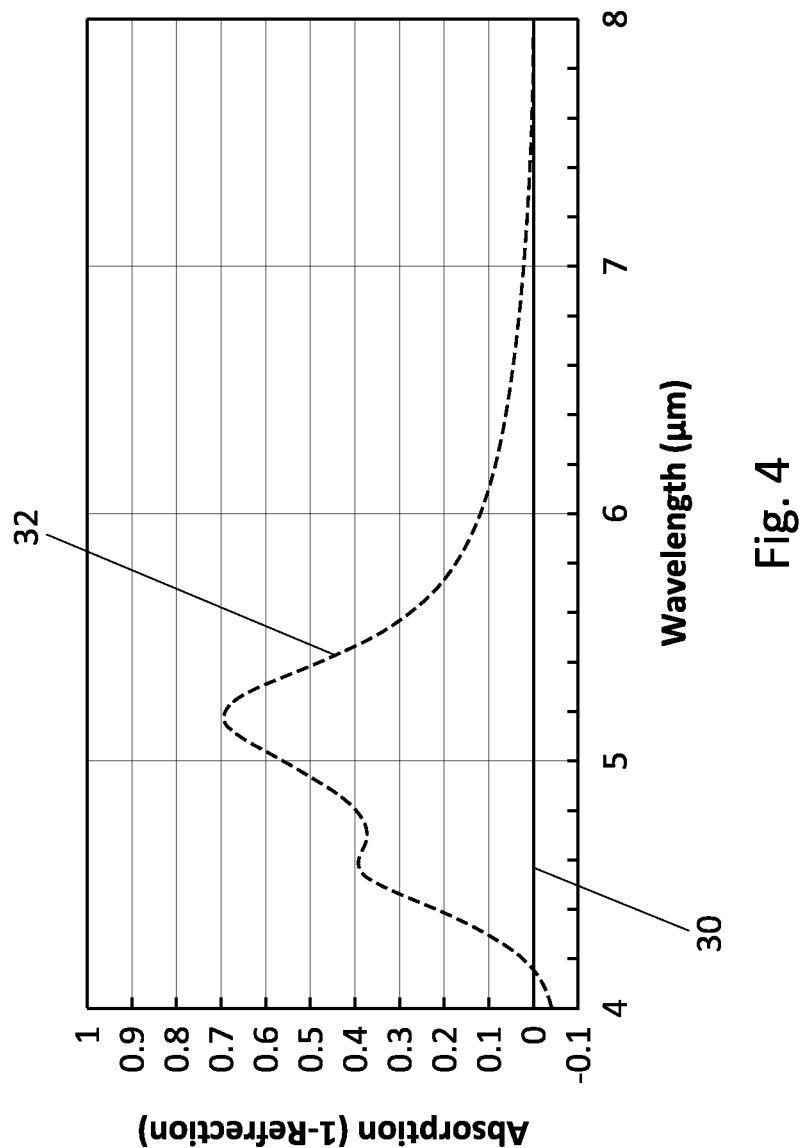
FIG. 4 illustrates the absorption spectra of an sensor device with an Mo surface without patterning (red-solid) and a sensor device with a 2 μm pitch and 1.5 μm diameter Mo hole array (blue-dashed).

The absorption properties of the hole array's infrared lights were verified by FTIR (Fourier Transform Infrared Spectrophotometry). The FTIR used in this research was a regular reflection type microscopic FTIR. The diameter of the infrared source lights on the sample was approximately 100 µm and gold flat film was used for calibration. To avoid the scattering effects from the deformation caused by the bent surface of the device, a sample with a flat surface, which did not go through DRIE, was used. FIG. 4 shows the absorption spectral. In FIG. 4, the diffractions are ignored, and 1-Reflection is used for the Absorption. The red solid line 30 in FIG. 4 is the response of a flat Mo electrode without pattern. The blue dashed line 32 is the response of a hole array with a 2 µm period and hole diameters of approximately 1.5 µm. FIG. 4 shows the observed strong infrared absorption at the 4.5 µm and 5.1 µm wavelengths with provided by the hole array structure. Conversely, FIG. 4 illustrates that there was no absorptions when there were no patterns on the Mo electrode.

The numerical calculation was done using the Fourier-difference time-domain (FDTD) approach. AlN refractive index was assumed to be 2.1 for the entire calculation wave range.

The radial dependencies of the hole arrays are depicted in FIG. 5. The period was fixed at 2 µm, and numerical calculations were done by gradually increasing the hole radius from 1.0 µm, 1.25 µm, to 1.5 µm. The line labelled 46 corresponds to a hole array with 1.0 µm holes; the line labelled 48 corresponds to a hole array with 1.25 µm holes; and, the line labelled 42 corresponds to a hole array with 1.5 µm holes. The absorption rates may be seen by the main peak growing towards the higher wavelengths as the hole radius increases, as well as the peak shifting as well as getting broader. The equal trend between the FIG. 4 experiment results and the numerical calculation results from FIG. 5, even with FIG. 5 showing highly sensitive absorption spectra to the hole radiuses, were confirmed. It may be assumed that the broader peak and lower peak position at 1.5 µm hole size in the FIG. 4 experiment result, when compared to the numerical calculation results, is due to the incident angle of the incident light from the regular reflection type FTIR not being vertical to the sensor sample.

Example 5

Figure 6A:
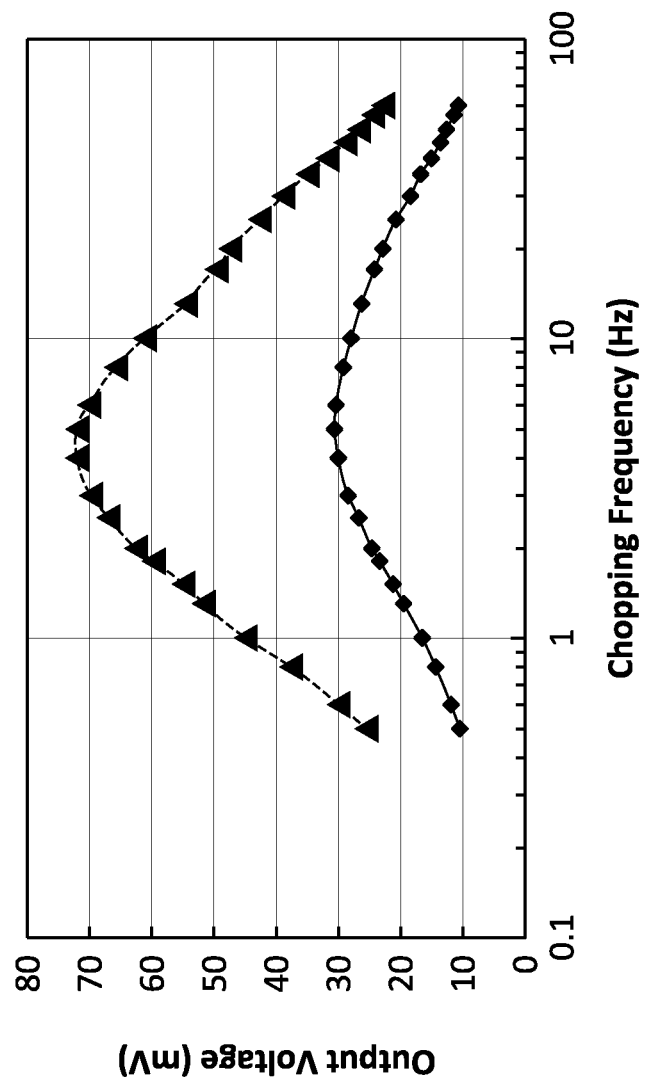
FIG. 6A illustrates the signal output chopping frequency dependency of a single Si Crystal for a sensor device with a hole array (blue triangle) versus a sensor without a hole array (red diamond).
Figure 6B:
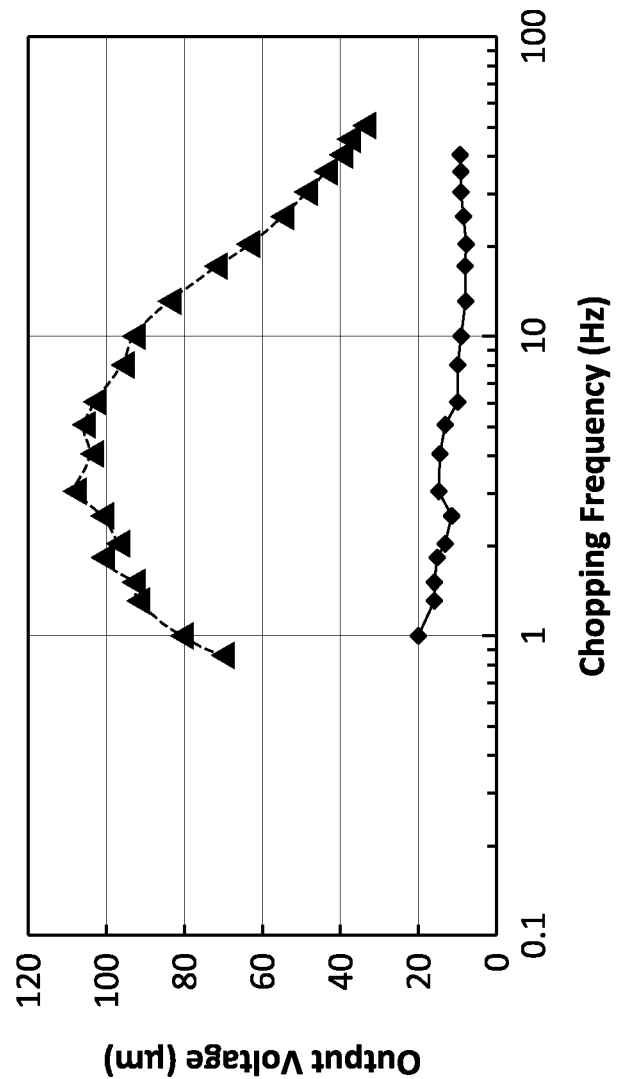
FIG. 6B illustrates the signal output chopping frequency dependency of a 5 μm long pass optical filter for a sensor device with a hole array (blue triangle) versus a sensor without a hole array (red diamond).

Next, experiments were performed to observe and verify the pyroelectric originating signals. The experiments were done in the atmosphere, and a small miniature bulb was used as the infrared light sources. The distance between the MEMS elements and the bulb was 50 mm. A mechanical chopper was placed between the MEMS sensor and the bulb. An optical filter filtering lights exceeding or at 5 µm, or a in the alternative a single crystal Si, were placed along with a chopper between the MEMS element and the infrared light source. Sensor A, with Mo electrode surface not patterned, and sensor B, with hole arrays implemented, were prepared as samples. MEMS elements were connected to a lock-in amplifier after they were through a buffer amplifier using Junction FET (JFET). FIG. 6A shows the signal when a single crystal Si was placed and FIG. 6B shows the signal when a 5 µm long pass filter was placed.

The voltage sensitivity equation for the pyroelectric sensor above is:

$$\Re_V(\omega) = \frac{p \cdot \eta \cdot \omega \cdot A \cdot R_p}{G \cdot \sqrt{1 + \omega^2 \cdot \tau_{th}^2} \cdot \sqrt{1 + \omega^2 \cdot \tau_{el}^2}} \quad (1)$$

where G is thermal conductance, η is the rate of infrared absorptions, ω is chopping frequency, Rp is the parallel resistance between the sensor's hot and ground terminal including JFET, A is area of the MEMS sensor element, and $\tau_{th}$ and $\tau_{el}$ are thermal time constant and electrical time constant, respectively.

Chopping frequency dependencies were observed in FIGS. 6A and 6B, and electrical cut-off and thermal cut-off frequencies were each recognized as 1.3 Hz and 17 Hz. FIG. 6A illustrates the difference between sensors A and B when an Si crystal was used as the filter. As may be seen, the difference is approximately half and considered small. Generally, Si crystals translate infrared light with wavelengths more than 1.2 µm. At this range, the bulb's light sources and the optical losses of the Mo electrode are large, and consequently, the signals became larger. On the other hand, when a 5 μm long pass filter was implemented, it overlaps with the main peak of the sensor B's infrared absorption, and while signal from sensor B can be examined, signals from sensor A were undistinguished. It was concluded that a selective infrared absorption has happened with this hole array structure, and it was verified by the pyroelectricity attributes of AlN. Meanwhile, as the light intensity of the light bulb significantly decreases when the wavelength of the infrared light source exceeds 5 μm, a smaller overall signal results.

Example 6

Figure 7:
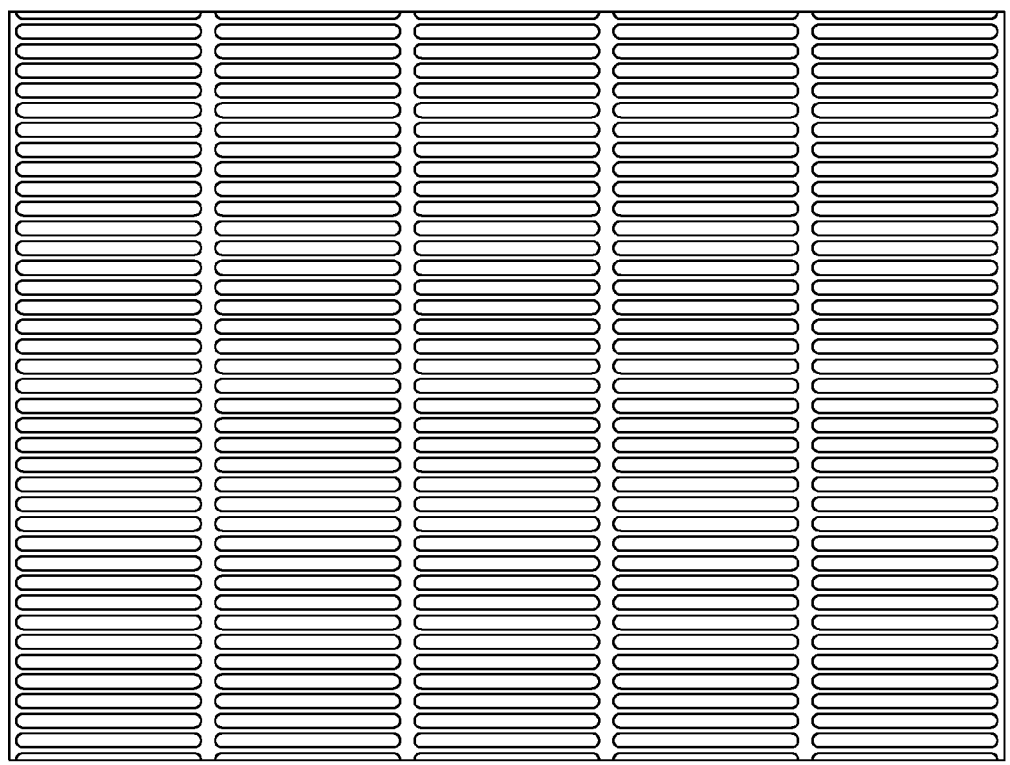
FIG. 7 is an optical microscope image of one embodiment of a sensor device with a 1 μm electrode 1 μm gap stripe structure.

FIG. 7 shows an actual Optical Microscope image of a sensor device with a 1 μm electrode and 1 μm gap stripe structure. Stripe-line structures implemented on the top electrode can absorb the polarized infrared light effectively. Accordingly, embodiments that wish to perform efficiently with polarized infrared light may implement stripe-line structures as the patterned periodic structure.

Figure 8:
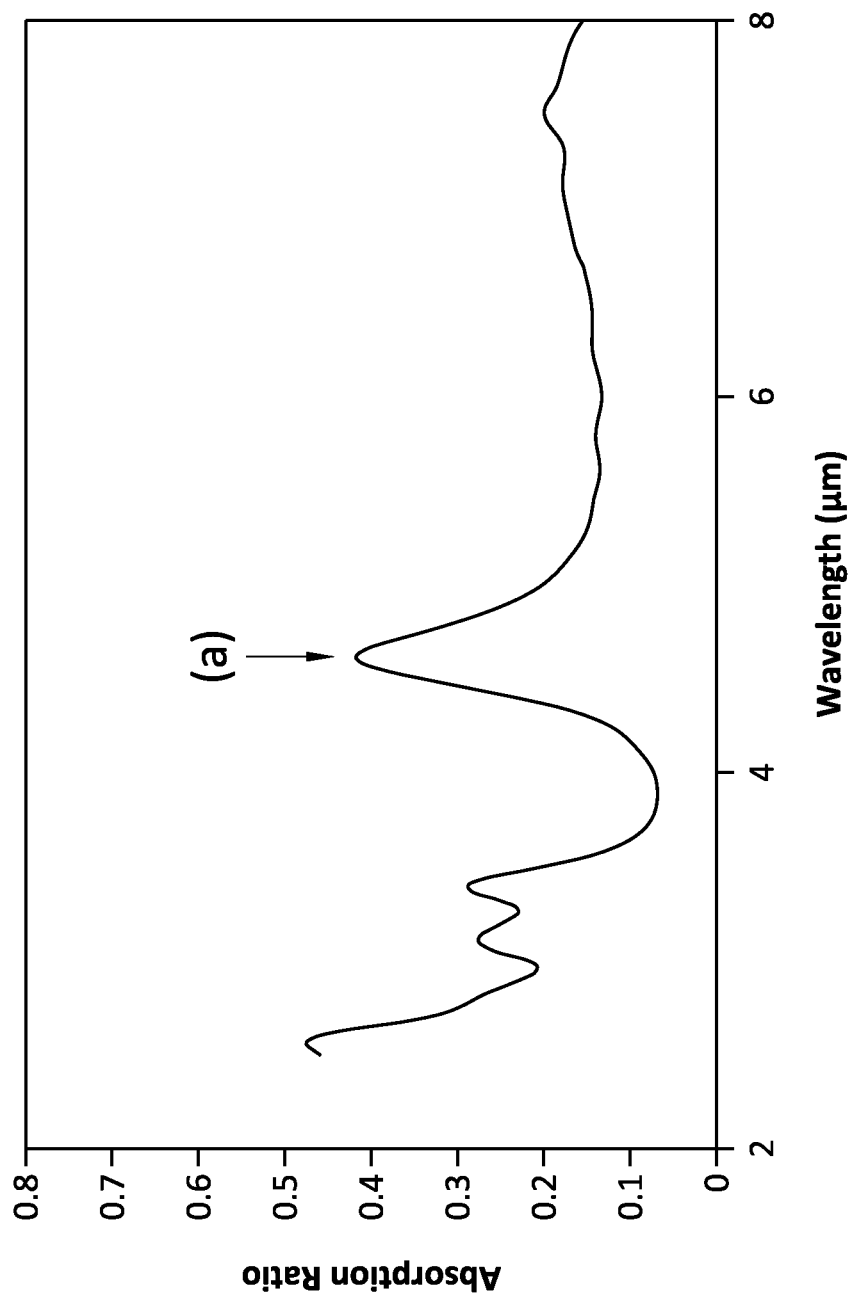
FIG. 8 illustrates the FTIR results of the sensor device of FIG. 7.

FIG. 8 shows the results of using the sensor device of FIG. 7. In this particular embodiment, peak (a) is suitable for detecting CO and $CO_2$, which have absorption lines close to 4.5 microns.

Figure 9:
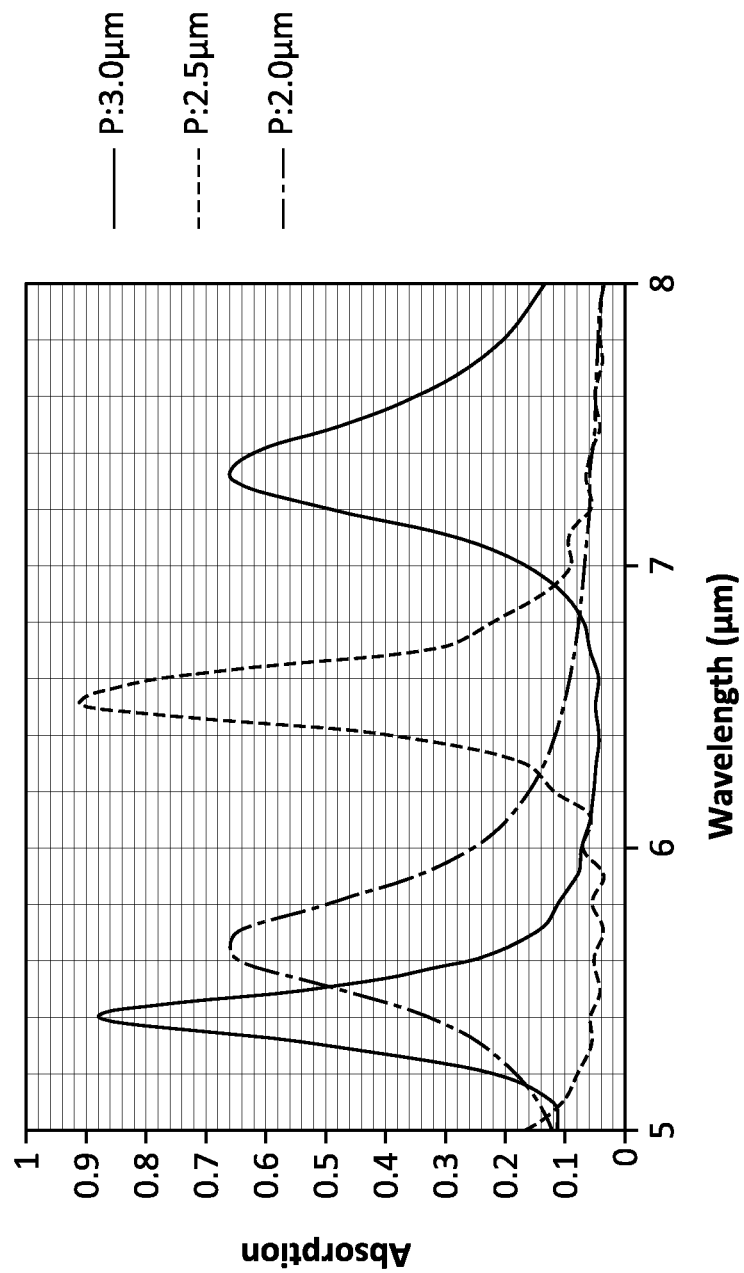
FIG. 9 illustrates the numerical FDTD calculation results which shows the peak position depends on the periodicity of top electrode hole array, herein. In the example of FIG. 9, the Piezoelectric AlN film thickness is 0.5 μm, r/P=0.75, and top and bottom Moly electrodes are 100 nm thickness.

FIG. 9 is the numerical FDTD calculation results which show that the absorption peak position depends on the periodicity of top electrode hole array. In this example, the Pyroelectric AlN film thickness is 0.5 μm, r/P=0.75 and the top and bottom Moly electrode thicknesses are 100 nm respectively.

Figure 10:
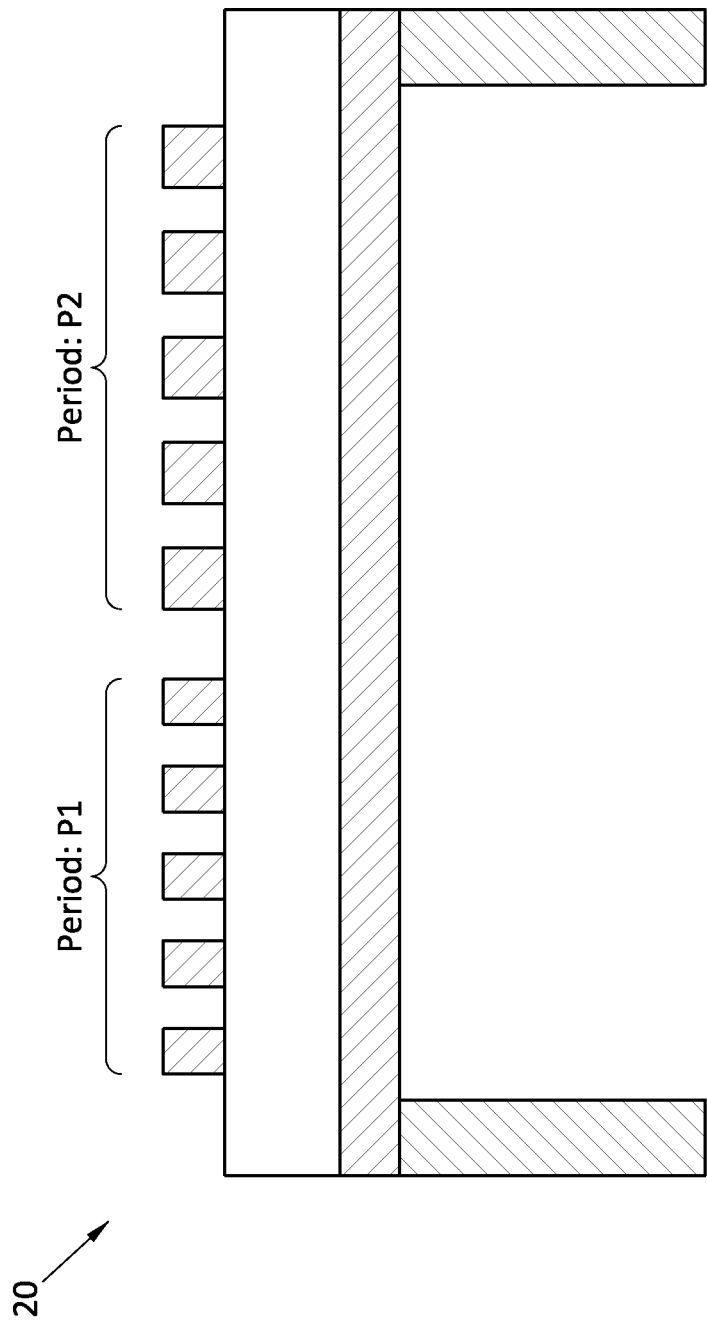
FIG. 10 illustrates one embodiment of a sensor device with multiple sensor elements on the same substrate.

FIG. 10 illustrates an embodiment of a sensor device 20 with multiple sensor elements patterned with different periodicities. This type of embodiment may be used to enable a CO and $CO_2$ multiple NDIR type gas sensor on the same substrate. In a preferred embodiment, no optical filter would be needed.

The present patent document discloses embodiments of a MEMS type pyroelectric sensor with highly c-axis orientated AlN film as the pyroelectric material, and with a periodic structure implemented on the top electrode. The MEMS type pyroelectric sensor may be prepared using a post CMOS compatible MEMS process. By implementing hole arrays or a stripe structure on the upper electrode, selected periodic infrared light absorptions may be achieved. These were verified by FTIR experiments and numerical calculation using the FDTD method. Also from the experiments, it was confirmed that the pyroelectric signal from the infrared absorption derived from the hole arrays. In different embodiments, the sensitivity of the sensor to different wavelengths of infrared light by be obtained by adjusting the radius and or the periods of the holes of the hole arrays, and or by changing the thickness of the AlN films. Accordingly, selective wave pyroelectric MEMS infrared light sensors, which do not need optical filters, may be produced.

Although the embodiments disclosed herein have been described with respect to infrared light, the embodiments are not limited to any particular wavelength or range of wavelengths in the electromagnetic spectrum. Other embodiments may employ the same techniques, structures and methods taught herein to construct sensor devices sensitive to wavelengths other than infrared without departing from the scope of the present patent document.

Although the embodiments have been described with reference to preferred configurations and specific examples, it will readily be appreciated by those skilled in the art that many modifications and adaptations of the MEMS sensor and methods related thereto are possible without departure from the spirit and scope of the embodiments as claimed hereinafter. Thus, it is to be clearly understood that this description is made only by way of example and not as a limitation on the scope of the embodiments as claimed below.

What is claimed is:

1. A MEMS sensor comprising:
   a substrate layer;
   a first electrode layer adjacent the substrate layer;
   a pyroelectric layer adjacent the first electrode layer; and
   a second electrode layer adjacent the pyroelectric layer,
   wherein the second electrode layer is patterned with a periodic structure that has a periodicity less than or equal to 8 μm.

2. The sensor of claim 1, wherein the patterned periodic structure comprises a hole array structure.

3. The sensor of claim 1, wherein the patterned periodic structure comprises a stripe structure.

4. The sensor of claim 1, wherein the periodic structure has a periodicity less than or equal to a target infrared wavelength according to the equation $P \leq \lambda$ where P is periodicity and $\lambda$ is target infrared wavelength.

5. The sensor of claim 1, wherein the sensor is comprised of at least two sensor elements and each of the two sensor elements has a periodic structure patterned with different periodicities.

6. The sensors of claims 1 through 5, wherein the pyroelectric layer comprises a material selected from the group consisting of PZT, ZnO, PVDF, AlN, and c-axis oriented AlN.

7. The sensor of claim 1, wherein the first electrode layer has a thickness ranging from about 10 nm to about 1000 nm.

8. The sensor of claim 1, wherein the first electrode layer comprises Molybdenum.

9. The sensor of claim 1, wherein the pyroelectric layer comprises AlN.

10. The sensor of claim 1, wherein the pyroelectric layer has a thickness according to the equation $2 \times t \times n_\lambda \leq \lambda$ where t is the pyroelectric film thickness, $\lambda$ is the target infrared wavelength, and $n_\lambda$ is the index of the pyroelectric material at the target infrared wavelength.

11. The sensor of claim 1, wherein the second electrode has a thickness ranging from about 10 nm to about 1000 nm.

12. The sensor of claim 1, wherein the second electrode comprises Molybdenum.

13. The sensor of claim 3, wherein the patterned periodic structure is a hole array and the diameter of a hole in the hole array is provided according to the equation $r \geq P \times 0.5$ where r is the hole diameter and P is the periodicity of the patterned periodic structure.

14. The sensor of claim 1, wherein the periodic structure comprises a stripe structure having a line/spacing (L/S) of about 1.

15. The sensor of claim 1, wherein the second electrode layer is a top layer of the sensor.

16. The sensor of claim 1, further comprising a second pyroelectric layer adjacent to the substrate layer.

17. The sensor of claim 1, wherein the periodic structure has a periodicity less than or equal to 105% of a target infrared wavelength according to the equation $P \leq 1.05 * \lambda$ where P is periodicity and $\lambda$ is target infrared wavelength.

18. A MEMS sensor element comprising:
   a substrate layer;
   a first electrode layer adjacent the substrate layer;
   a pyroelectric layer adjacent the first electrode layer; and
   a second electrode layer adjacent the pyroelectric layer,
   wherein the second electrode layer is patterned with a periodic structure that has a periodicity less than or equal to a target infrared wavelength.

19. A method of making a MEMS sensor element, the method comprising:
- forming a first electrode layer on a substrate;
- forming a pyroelectric layer adjacent the electrode layer;
- forming a second electrode layer adjacent the pyroelectric layer; and,
- patterning the second electrode layer of the MEMS sensor to have a patterned periodic structure with a periodicity less than or equal to a target infrared wavelength.

* * * * *